(12) United States Patent
Yudahira

(10) Patent No.: US 7,557,585 B2
(45) Date of Patent: Jul. 7, 2009

(54) ABNORMAL VOLTAGE DETECTION APPARATUS FOR DETECTING VOLTAGE ABNORMALITY IN ASSEMBLED BATTERY

(75) Inventor: Hirofumi Yudahira, Kagoshima (JP)

(73) Assignee: Panasonic EV Energy Co., Ltd., Kosai-Shi (JP)

( * ) Notice: Subject to any disclaimer, the term of this patent is extended or adjusted under 35 U.S.C. 154(b) by 535 days.

(21) Appl. No.: 11/157,021

(22) Filed: Jun. 20, 2005

(65) Prior Publication Data

US 2006/0001403 A1    Jan. 5, 2006

(30) Foreign Application Priority Data

Jun. 21, 2004    (JP)    ............................. 2004-181995

(51) Int. Cl.
G01N 27/416    (2006.01)
H02J 7/00    (2006.01)

(52) U.S. Cl. ..................... 324/433; 324/434; 320/132

(58) Field of Classification Search ......... 324/425–433, 324/434; 326/63, 83; 327/100; 320/132, 320/148, 156–159, 161–164
See application file for complete search history.

(56) References Cited

U.S. PATENT DOCUMENTS

| 5,705,914 A | 1/1998 | Morita |
| 5,760,587 A * | 6/1998 | Harvey ........................ 324/434 |
| 7,282,890 B2 * | 10/2007 | Adachi ........................ 320/116 |

FOREIGN PATENT DOCUMENTS

JP    9-159701    6/1997

* cited by examiner

*Primary Examiner*—Akm E Ullah
*Assistant Examiner*—Richard V Muralidar
(74) *Attorney, Agent, or Firm*—Workman Nydegger

(57) ABSTRACT

An abnormal voltage detection apparatus is provided for an assembled battery including a plurality of battery blocks connected in series to each other. In the abnormal voltage detection apparatus, each of a plurality of signal detectors is provided in each of battery blocks. Each of the signal detectors detects voltage abnormality or normality in each battery block based on a voltage of each battery block, generates an abnormality detecting signal containing information about the detected voltage abnormality or normality, and outputs the abnormality detecting signal. A signal generator generates an abnormality detecting information signal containing information about whether or not any of the battery blocks in the voltage abnormality is present based on the abnormality detecting signals. A transmission device has an input terminal pair and an output terminal pair which are electrically insulated from each other, and transmits the abnormality detecting information signal to an external apparatus.

12 Claims, 4 Drawing Sheets

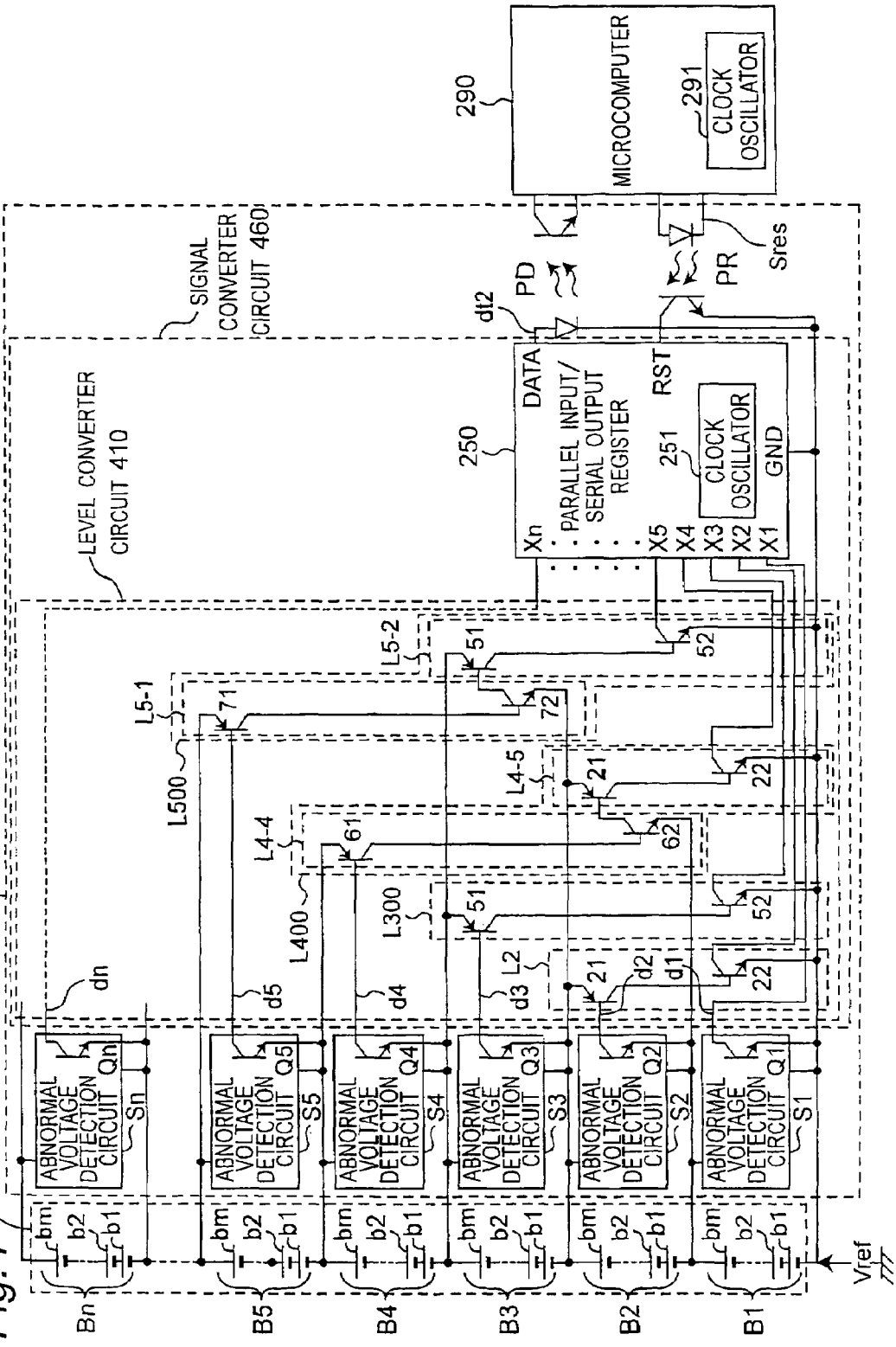

ABNORMAL VOLTAGE DETECTION APPARATUS FOR DETECTING VOLTAGE ABNORMALITY IN ASSEMBLED BATTERY

BACKGROUND OF THE INVENTION

1. Field of the Invention

The present invention relates to an abnormal voltage detection apparatus for use in an assembled battery, and in particular, to an abnormal voltage detection apparatus for detecting voltage abnormality in the assembled battery.

2. Description of the Related Art

A sealed nickel-metal hydride battery (hereinafter referred to as a "nickel-hydrogen battery") is excellent in basic characteristics, such as energy density, output density and cycle life. Accordingly, in recent years, attention has been given to such a nickel-hydrogen battery as a power source for motors and as a drive source for various loads in electric vehicles, such as pure electric vehicles (PEVs) and hybrid electric vehicles (HEVs). Development has thus been advancing to make such a nickel-hydrogen battery practical.

When nickel-hydrogen battery is used as a power source for electric vehicles, a total voltage of approximately 100 V to 350 V is required to obtain a predetermined drive output. The output voltage of a cell, which is the minimum unit constituting the nickel-hydrogen battery, is approximately 1.2 V. Therefore, an assembled battery including a plurality of battery blocks, each battery block including at least one cell, is used to obtain a desired total voltage.

The temperatures of the cells constituting the assembled battery are not uniform. In particular, in such an environment that the assembled battery is used in a vehicle, temperature differences may occur among the cells. Furthermore, the remaining capacity and the charging efficiency (the ratio of the charged electric quantity to the supplied electric quantity) of respective cells are different from each other depending on production process and usage conditions after the production. For these reasons, the cells constituting the assembled battery have variations in the actual remaining capacity (SOC: state of charge), and the range of the capacity usable as the capacity of the assembled battery is narrowed. In other words, the service life of the assembled battery is apparently shortened significantly. In the assembled battery, it is important to detect the voltage of each cell or battery block constituting the assembled battery, and to judge whether or not the voltage is abnormal to carry out charging or discharging control.

The Japanese patent laid-open publication No. JP-9-159701-A disclosed an overvoltage detection apparatus for use in an assembled battery according to a conventional example. The overvoltage detection apparatus according to the conventional example can detect overvoltage for each cell (battery block) constituting the assembled battery and can judge whether its overvoltage detection function is normal or abnormal.

In an electric vehicle, a high-voltage circuit including an assembled battery is electrically insulated from the chassis from the point of view of safety. On the other hand, a low-voltage circuit including a controlling devices, such as a microcomputer for controlling the charging and discharging of the assembled battery, uses the electric potential of the chassis as a reference electric potential. Therefore, it is necessary to provide such a circuit configuration that the high voltage generated by the battery blocks or cells constituting the assembled battery is not applied directly to the low-voltage circuit including controlling devices, such as the microcomputer. Furthermore, in an assembled battery for electric vehicles, the difference between the electric potential of a cell having the highest electric potential and the electric potential of a cell having the lowest electric potential reaches 200 V or more. Therefore, the voltage levels of the input signal, output signal and the control signals of overvoltage detection circuits provided in each cell cannot be handled altogether. In the overvoltage detection apparatus according to the conventional example, an input transmission device and an output transmission device, each having an input terminal pair and an output terminal pair being electrically insulated from each other, are provided for each cell. Input signals, such as control signals for each cell, are inputted from the outside via the transmission devices, and then, an overvoltage detection signal for each cell is outputted via the corresponding transmission device.

However, generally speaking, such a transmission device, such as a photo-coupler, having an input terminal pair and an output terminal pair being electrically insulated from each other is expensive and large in size. The overvoltage detection apparatus according to the conventional example includes transmission devices, each having an input terminal pair and an output terminal pair being electrically insulated from each other, and the number of the transmission devices is an integral multiple of the number of cells. For this reason, the overvoltage detection apparatus has such a problem as being expensive and large in size.

SUMMARY OF THE INVENTION

An essential of the present invention is therefore to provide an abnormal voltage detection apparatus for use in an assembled battery including a plurality of battery blocks connected in series, capable of being smaller in size and inexpensive, as compared with the conventional example.

In order to achieve the aforementioned objective, according to one aspect of the present invention, there is provided an abnormal voltage detection apparatus for use in an assembled battery. The abnormal voltage detection apparatus detects voltage abnormality in the assembled battery. The assembled battery includes a plurality of battery blocks connected in series to each other, and each battery block includes at least one secondary battery. The abnormal voltage detection apparatus includes a plurality of signal detectors, a signal generator, and a first transmission device. The signal detectors are each provided in each of battery blocks. Each of the signal detectors detects either one of voltage abnormality and normality in each battery block based on a voltage of each battery block, generates an abnormality detecting signal containing information about either detected one of the voltage abnormality and normality, and outputs the abnormality detecting signal. The signal generator generates an abnormality detecting information signal containing information about whether or not any of the battery blocks in the voltage abnormality is present based on the abnormality detecting signals. The first transmission device has an input terminal pair and an output terminal pair which are electrically insulated from each other, and transmits the abnormality detecting information signal to an external apparatus.

In the above-mentioned abnormal voltage detection apparatus, the signal generator calculates a logical sum of the abnormality detecting signals, and generates an abnormality detecting information signal containing a calculated logical sum as information about whether or not any of the battery blocks in the voltage abnormality is present.

The abnormal voltage detection apparatus according to the present invention uses only one transmission device having an input terminal pair and an output terminal pair which are electrically insulated from each other. Since such transmission device is large in size and expensive, the abnormal voltage detection apparatus is small in size and inexpensive.

An abnormal voltage detection apparatus according to the present invention outputs the abnormality detecting information signal containing information about whether or not any of the battery blocks in the voltage abnormality is present. The external apparatus, such as a microcomputer, to which the abnormality detecting signal is inputted, informs the user that at least one battery block with voltage abnormality has appeared, for example.

The concrete substances of voltage abnormality can be defined arbitrary. For example, voltage abnormality is such a state that a battery block is overcharged to a voltage higher than a predetermined threshold value or such a state that a battery block is over-discharged to a voltage lower than a predetermined threshold value.

It is assumed that the troubles of a battery includes increasing in internal resistance following the end of the service life or breakage of the cell case, cell short-circuit, etc. The voltage of the battery with such troubles is higher or lower than the voltage of a normal cell, and therefore, the troubles can be detected as the same voltage behaviors as overcharging or over-discharging.

According to another aspect of the present invention, there is provided an abnormal voltage detection apparatus for use in an assembled battery. The abnormal voltage detection apparatus detects voltage abnormality in the assembled battery. The assembled battery includes a plurality of battery blocks connected in series to each other, and each battery block includes at least one secondary battery. The abnormal voltage detection apparatus includes a plurality of signal detectors, a signal converter, and a first transmission device. The signal detectors are each provided in each of battery blocks. Each of the signal detectors detects either one of voltage abnormality and normality in each battery block based on a voltage of each battery block, generates an abnormality detecting signal containing information about either detected one of the voltage abnormality and normality, and outputs the abnormality detecting signal. The signal converter generates and outputs an abnormality detecting information signal containing information about the abnormality detecting signals based on the respective abnormality detecting signals. The first transmission device has an input terminal pair and an output terminal pair which are electrically insulated from each other, and transmits the abnormality detecting information signal to an external apparatus.

In the above-mentioned abnormal voltage detection apparatus, a plurality of the abnormality detecting signals are parallel signals, and the abnormality detecting information signal is a serial signal. The signal converter includes a parallel-serial converter for converting a plurality of the abnormality detecting signals into the abnormality detecting information signal, and outputting the abnormality detecting information signal.

An abnormal voltage detection apparatus according to the present invention can output the abnormality detecting information signal containing information about whether each of battery blocks is normal or abnormal. The external apparatus, such as a microcomputer, to which the abnormality detecting information signal is inputted, can carry out predetermined control (for example, discharging an overcharged battery block) for the battery block in the voltage abnormality. The abnormal voltage detection apparatus according to the present invention uses only two transmission devices, each of which has an input terminal pair and an output terminal pair which are electrically insulated from each other. Since such transmission device is large in size and expensive, the abnormal voltage detection apparatus is small in size and inexpensive.

In the above-mentioned abnormal voltage detection apparatus, the signal converter includes a level converter provided at a former stage of the parallel-serial converter. The level converter converts a voltage level of each of the abnormality detecting signals into each of converted voltage levels, and outputs the abnormality detecting signals each having the converted voltage level.

In the above-mentioned abnormal voltage detection apparatus, the converted voltage levels are substantially the same as each other. The level converter converts the voltage level of each of the abnormality detecting signals into each of the converted voltage levels, respectively, by resistance voltage division circuits.

The voltage levels of the abnormality detecting signals are different from each other. With the above-mentioned configuration, the level converter can convert the voltage level of each of the abnormality detecting signals into each of converted voltage levels, and outputs the abnormality detecting signals each having the converted voltage level.

In the above-mentioned abnormal voltage detection apparatus, the converted voltage levels are substantially the same as each other. The level converter converts the voltage level of each of the abnormality detecting signals into each of the converted voltage levels, respectively, by level converter circuits each including transistors and each utilizing voltage differences each between electrodes of each transistor.

In the above-mentioned abnormal voltage detection apparatus, the converted voltage levels are substantially the same as each other. The level converter converts the voltage level of at least one of the abnormality detecting signals into each of the converted voltage levels, respectively, by level converter circuits each including transistors and each utilizing voltage differences each between electrodes of each transistor.

In the above-mentioned abnormal voltage detection apparatus, each of the level converter circuits lowers the voltage level of the abnormality detecting signal stepwise by a unit voltage, which is a voltage between the terminals of each of battery blocks, to convert the voltage level thereof into the converted voltage level.

In the above-mentioned abnormal voltage detection apparatus, the level converter circuits include a first level lowering circuit and a second level lowering circuit. The first level lowering circuit lowers the voltage level of the abnormality detecting signal for a first battery block of the battery blocks only by a unit voltage, which is a voltage between the terminals of each of battery blocks, to convert the voltage level thereof into the converted voltage level. The second level lowering circuit lowers the voltage level of the abnormality detecting signal for a second battery block of the battery blocks by a plurality of the unit voltages, to convert the voltage level thereof into the converted voltage level.

The above-mentioned abnormal voltage detection apparatus further includes a third level lowering circuit. The third level lowering circuit lowers the voltage level of the abnormality detecting signal for a third battery block of the battery blocks by the plurality of the unit voltages and then lowers a lowered voltage level thereof by the unit voltage to convert the voltage level thereof into the converted voltage level.

The level converter circuit for converting the voltage of each of battery blocks of the assembled battery which has a total voltage of approximately 100 V to 350 V usually includes numerous expensive and large switching devices having a high withstand voltage.

With the present invention, the level converter part is configured by utilizing only inexpensive and small switching devices having a low withstand voltage. The present invention can thus realize the abnormal voltage detection apparatus which is inexpensive and small in size.

The above-mentioned abnormal voltage detection apparatus further includes a second transmission device having an input terminal pair and an output terminal pair which are electrically insulated from each other. The second transmission device transmits an output command signal generated by the external apparatus to the parallel-serial converter. The parallel-serial converter starts generating and outputting of the abnormality detecting information signal in accordance with the output command signal from the second transmission device.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 4 is a block diagram showing a schematic configuration of an abnormal voltage detection apparatus for use in an assembled battery according to a fourth preferred embodiment of the present invention.

DETAILED DESCRIPTION OF THE PREFERRED EMBODIMENTS

Preferred embodiments according to the present invention will be described below with reference to the attached drawings.

First Preferred Embodiment

Figure 1:
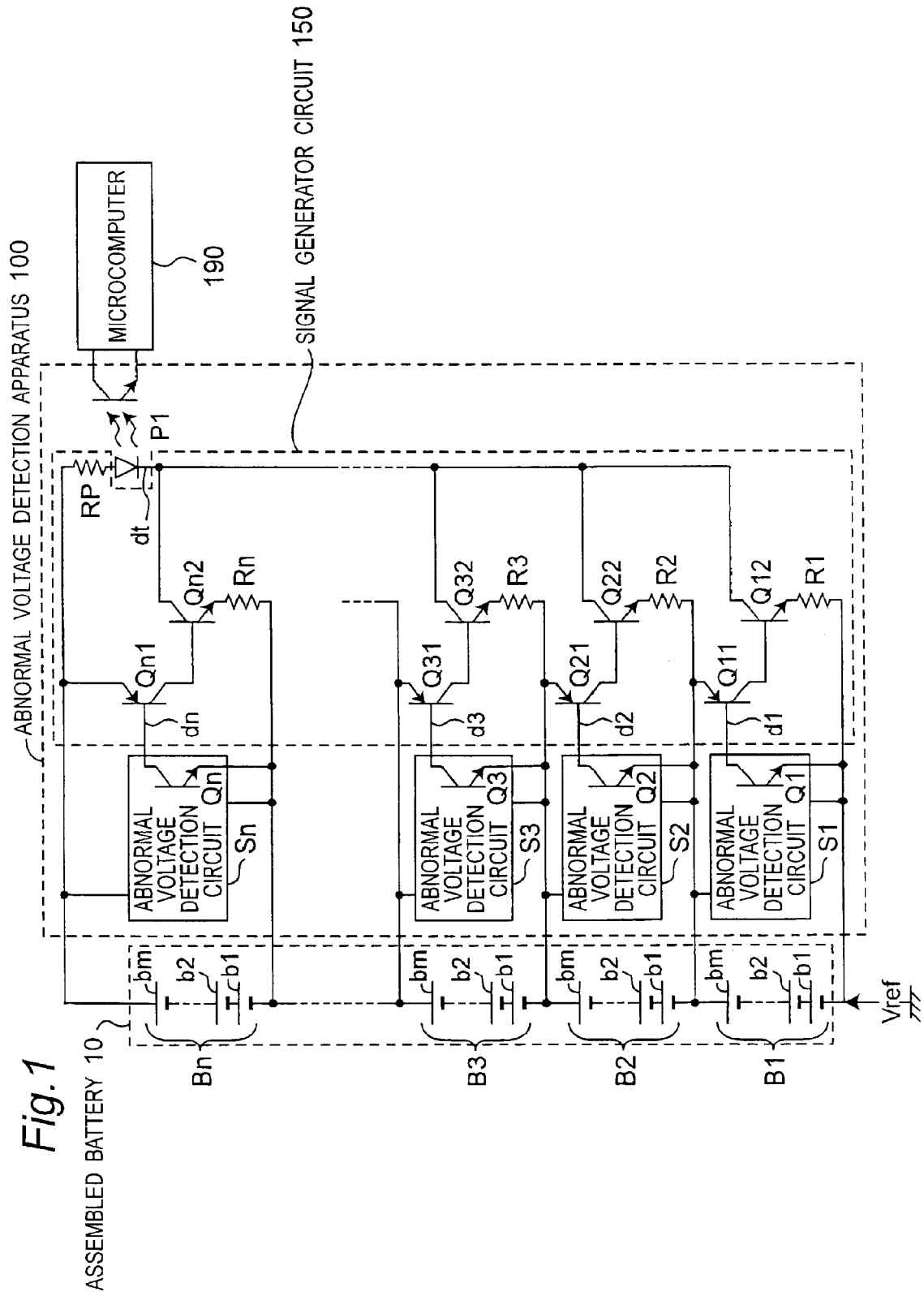
FIG. 1 is a block diagram showing a schematic configuration of an abnormal voltage detection apparatus for use in an assembled battery according to a first preferred embodiment of the present invention.

An abnormal voltage detection apparatus 100 for use in an assembled battery according to a first preferred embodiment of the present invention will be described below with reference to FIG. 1. FIG. 1 is a block diagram showing a schematic configuration of the abnormal voltage detection apparatus for use in an assembled battery according to the first preferred embodiment of the present invention.

Referring to FIG. 1, an assembled battery 10, the abnormal voltage detection apparatus 100 and a microcomputer 190 are all installed in an electric vehicle. The DC power of the assembled battery 10 is converted into AC power by an inverter (not shown), and the AC power drives a motor (not shown), so that the electric vehicle runs.

The assembled battery 10 has such a configuration that "n" battery blocks B1 to Bn (n is a positive integer of two or more. n=20 in the first preferred embodiment) are connected in series to each other. Furthermore, each of the battery blocks B1 to Bn includes m, (where m is a positive integer of 2 or more, and m=12 in the first preferred embodiment), secondary cells b1 to bm connected in series to each other. With this configuration, the assembled battery 10 becomes an assembled battery having 240 cells in total. In the first preferred embodiment, each of cells b1 to bm is a nickel-hydrogen battery having a nominal voltage of 1.2 V. Therefore, 14.4 V is obtained from each battery block, and a total nominal voltage of 288 V is obtained from the assembled battery 10. In this description, the higher electric-potential side of the assembled battery 10 is referred to as "high-order" and the lower electric-potential side thereof is referred to as "low-order." Furthermore, the lowest-order battery block is designated by B1, and the highest-order battery block is designated by Bn.

The abnormal voltage detection apparatus 100 includes abnormal voltage detection circuits S1 to Sn, a signal generator circuit 150, and a photo-coupler P1. The signal generator circuit 150 includes pnp transistors Q11, Q21, Q31, . . . and Qn1, npn transistors Q12, Q22, Q32, . . . and Qn2, resistors R1 to Rn, and a resistor RP.

The abnormal voltage detection circuits S1 to Sn are each provided in the battery blocks B1 to Bn, respectively. Each of abnormal voltage detection circuit detects that the voltage between the positive and negative electrodes of the corresponding battery block has risen above a first predetermined value and has become an overcharged state or that the voltage has lowered below a second predetermined value and has become an over-discharged state. The first predetermined value is greater than the second predetermined value. If each of the abnormal voltage detection circuits S1 to Sn detects the overcharged state or the over-discharged state of the corresponding battery block, it generates and outputs each of abnormality detecting signals d1 to dn, respectively. In other words, if each of the abnormal voltage detection circuits S1 to Sn detects the voltage abnormality or normality in the corresponding battery block based on the voltage of the battery block, it generates and outputs each of abnormality detecting signals d1 to dn, containing information about the detected voltage abnormality or normality, respectively.

In the first preferred embodiment, the output stage of each of the abnormal voltage detection circuits S1 to Sn includes npn transistors Q1 to Qn, respectively. The emitter electrode of each of the npn transistors Q1 to Qn is connected to the negative electrode of the corresponding battery block, and the collector electrode thereof is used as an output terminal. If one of the abnormal voltage detection circuits S1 to Sn detects voltage abnormality in the corresponding battery block, the corresponding npn transistor, which is one of the npn transistors Q1 to Qn serving as an output stage, turns on.

The pair of the pnp transistor Qk1 ($1 \leq k \leq n$) and the npn transistor Qk2 constitute a voltage level converter and current amplification circuit.

The output terminal (the collector electrode of the npn transistor Q1) of the abnormal voltage detection circuit S1 is connected to the base electrode of the pnp transistor Q11. The emitter electrode of the pnp transistor Q11 is connected to the positive electrode of the battery block B1, and the collector electrode thereof is connected to the base electrode of the npn transistor Q12. The emitter electrode of the npn transistor Q12 is connected to the negative electrode of the battery block B1 via the resistor R1.

The output terminal (the collector electrode of the npn transistor Q2) of the abnormal voltage detection circuit S2 is connected to the base electrode of the pnp transistor Q21. The emitter electrode of the pnp transistor Q21 is connected to the positive electrode of the battery block B2, and the collector electrode thereof is connected to the base electrode of the npn transistor Q22. The emitter electrode of the npn transistor Q22 is connected to the negative electrode of the battery block B2 via the resistor R2.

The output terminals of the subsequent abnormal voltage detection circuits S3, S4, . . . and Sn are also connected to circuits each including an npn transistor, a pnp transistor and a resistor, as in the abnormal voltage detection circuits S1 and S2. The output terminal (the collector electrode of the npn transistor Qn) of the abnormal voltage detection circuit Sn is connected to the base electrode of the pnp transistor Qn1. The emitter electrode of the pnp transistor Qn1 is connected to the positive electrode of the battery block Bn, and the collector electrode thereof is connected to the base electrode of the npn transistor Qn2. The emitter electrode of the npn transistor Qn2 is connected to the negative electrode of the battery block Bn via the resistor Rn.

The photo-coupler P1 includes a light-emitting diode and a phototransistor being used in a pair. The photo-coupler P1 forms a first transmission device, having an input terminal pair and an output terminal pair which are electrically insulated from each other. The abnormality detecting signals d1 to dn are inputted to the photo-coupler P1. An abnormality detecting information signal dt containing information indicating whether or not a battery block in the voltage abnormality is present is transmitted from the photo-coupler P1 to the microcomputer 190.

The collector electrodes of the npn transistors Q12, Q22, Q32, and Qn2 are wired-OR connected to a series connection of the resistor RP and the input light-emitting diode of the photo-coupler P1 using one electric wire. In other words, if any npn transistor Qk2 ($1 \leq k \leq n$) turns on, a current flows in the series connection circuit of the input light-emitting diode of the photo-coupler P1 and the resistor RP, and the input light-emitting diode of the photo-coupler P1 emits light.

The voltage between the terminals of one battery block is assumed to be a unit voltage. For example, if the npn transistor Qn2 turns on, a one-unit voltage is applied to the resistor RP, the input light-emitting diode of the photo-coupler P1, the npn transistor Qn2 and the resistor Rn. For example, if the npn transistor Q12 turns on, n-unit voltages are applied to the resistor RP, the input light-emitting diode of the photo-coupler P1, the npn transistor Q12 and the resistor R1. The values of the resistors R1 to Rn are different from one another and set so that even if any npn transistor Qk2 ($1 \leq k \leq n$) turns on, the current flowing in the input light-emitting diode of the photo-coupler P1 becomes almost constant.

The resistor RP is a device for restricting the current flowing in the input light-emitting diode of the photo-coupler P1 when a plurality of npn transistors Qk2 ($1 \leq k \leq n$) turn on. A constant current circuit may be also used instead of the resistor RP. The resistor RP may be eliminated if no problem occurs in the quality of the product.

The microcomputer 190 is driven by a low-voltage power source (not shown) such as a lead-acid battery having an output voltage of 12 V or the like. The abnormality detecting information signal dt, the output signal of the abnormal voltage detection apparatus 100 is inputted to the microcomputer 190 via the phototransistor of one photo-coupler P1. The microcomputer 190 is electrically insulated from the assembled battery 10 having a high voltage by the photo-coupler P1.

The operation of the abnormal voltage detection apparatus 100 configured as described above will be described below. The operation of the abnormal voltage detection apparatus 100 when the battery block B1 is abnormal, that is, overcharged or over-discharged, will be described. If the abnormal voltage detection circuit S1 detects that the battery block B1 is overcharged or over-discharged, the npn transistor Q1 turns on. The abnormal voltage detection circuit S1 outputs the abnormality detecting signal d1. A base current flows in the base electrode of the pnp transistor Q11, and the pnp transistor Q11 also turns on. Furthermore, a base current flows in the base electrode of the npn transistor Q12 from the emitter of the pnp transistor Q11 via the collector thereof. The npn transistor Q12 thus turns on. As a result, a current flows in the resistor RP and the resistor R1, and the abnormal voltage detection apparatus 100 outputs an abnormality detecting information signal dt to the microcomputer 190 via the photo-coupler P1.

In a similar way, if the abnormal voltage detection circuit Sk ($1 \leq k \leq n$) detects that the corresponding battery block is overcharged or over-discharged, the corresponding npn transistor Qk2 turns on. The abnormality detecting signal dk is outputted. Therefore, if an abnormality detecting signal is outputted from at least one abnormal voltage detection circuit, a current flows in the series connection of the input light-emitting diode of the photo-coupler P1 and the resistor RP, and the light-emitting diode of the photo-coupler P1 emits light. In other words, an abonormality detecting information signal dt is outputted.

The light of the light-emitting diode is inputted to the output phototransistor of the photo-coupler P1, and the output phototransistor turns on. After receiving the abnormality detecting information signal dt, the microcomputer 190 can carry out predetermined control operations, such as the indication of a battery block having voltage abnormality and the limitation in the current of charging or discharging the assembled battery 10.

When all the battery blocks B1 to Bn are normal (not overcharged or over-discharged), the npn transistors Q1 to Qn, the pnp transistors Q11 to Qn1 and the npn transistors Q12 to Qn2 all remain in an off state. Therefore, no current flows in the resistor RP, and abnormality detecting information signal dt is not outputted from the abnormal voltage detection apparatus 100.

To each of the npn transistors Q12 to Qn2, a voltage close to the voltage difference between the negative electrode voltage of the corresponding battery block and the positive electrode voltage of the highest-order battery block Bn is applied. For this reason, transistors having a high withstand voltage of several hundred volts are used for the npn transistors Q12 to Qn2 (or at least some of them). To each of the pnp transistors Q11 to Qn1, approximately only a voltage between the positive and negative electrodes of the corresponding battery block (14.4 V in the first preferred embodiment) is applied. Therefore, inexpensive devices having a low withstand voltage of several tens of volts can be used for the pnp transistors Q11 to Qn1.

The abnormal voltage detection apparatus for use in an assembled battery according to the first preferred embodiment of the present invention uses only one electric insulating device (photo-coupler) that is large in size and expensive. Therefore, the abnormal voltage detection apparatus for use in an assembled battery according to the first preferred embodiment of the present invention is small in size and inexpensive.

The npn transistors Q12, Q22, Q32, . . . and Qn2 are connected so as to form a wired-OR circuit. However, instead of the wired-OR circuit, an OR logic circuit, for example, may be also used.

The voltage level converter and current amplification circuit which include the pair of the pnp transistor Qk1 and the npn transistor Qk2 out puts a Low-level signal when the voltage abnormality is detected. Instead of this, the voltage level converter and current amplification circuit may output a High-level signal if the circuit detects voltage abnormality. For example, the pnp transistor Qk1 ($1 \leq k \leq n$) may be formed of a device having a high withstand voltage and a high current amplification factor, and the collector electrode of the pnp transistor Qkl may be connected to the anode side of the input light-emitting diode of the photo-coupler P1. The other end of the series connection of the resistor RP and the input light-emitting diode of the photo-coupler P1 is connected to the negative electrode of the lowest-order battery block B1.

Second Preferred Embodiment

Figure 2:
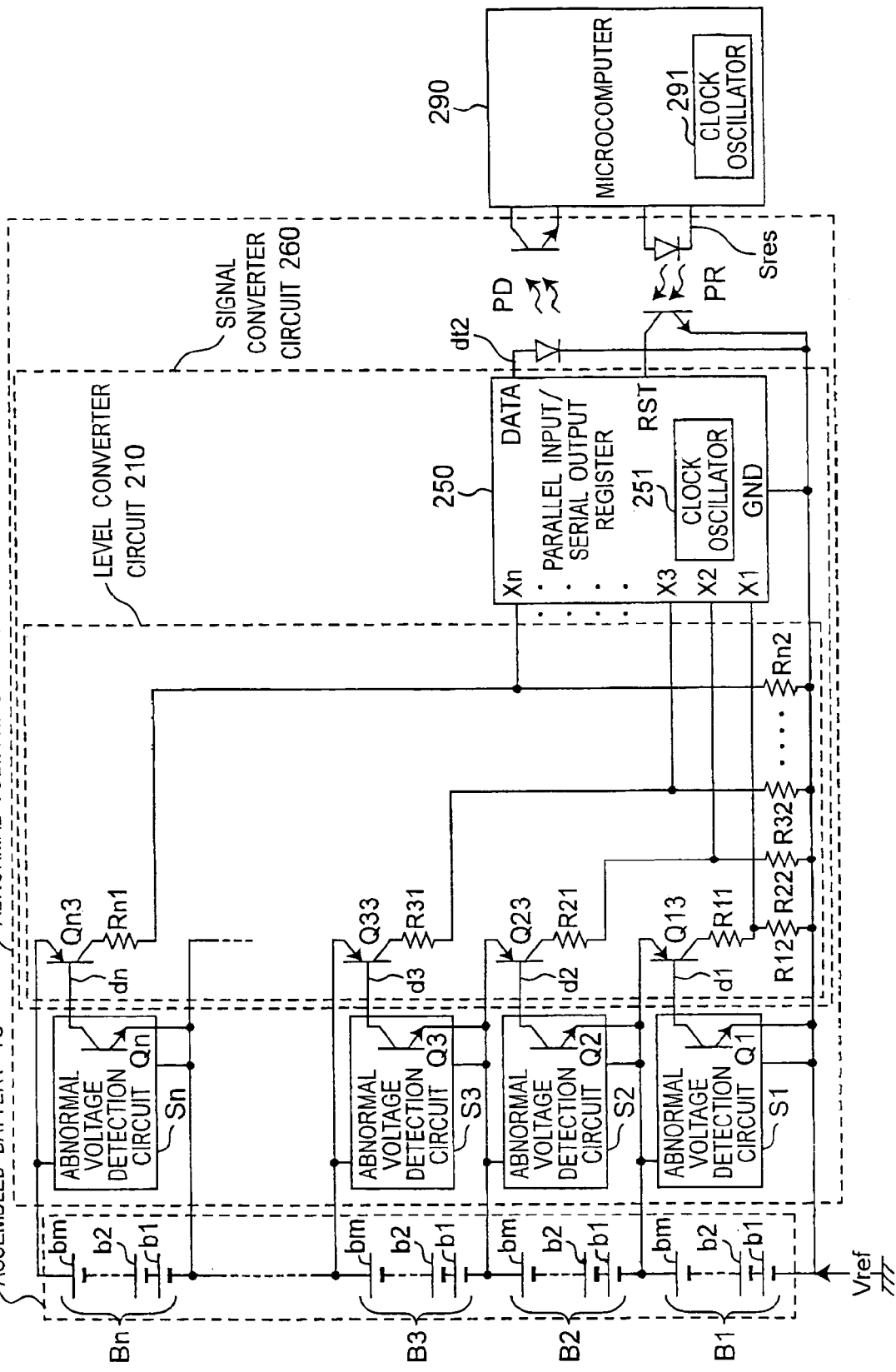
FIG. 2 is a block diagram showing a schematic configuration of an abnormal voltage detection apparatus for use in an assembled battery according to a second preferred embodiment of the present invention.

FIG. 2 is a block diagram showing a schematic configuration of the abnormal voltage detection apparatus for use in an assembled battery according to the second preferred embodiment of the present invention. In FIG. 2, components common to those shown in FIG. 1 are designated by common numerals, and their descriptions are omitted.

The abnormal voltage detection apparatus 100 according to the first preferred embodiment outputs an abnormality detecting information signal dt when at least one of the battery blocks B1 to Bn constituting the assembled battery 10 is abnormal, that is, overcharged or over-discharged. The abnormality detecting information signal dt does not include information for identifying an abnormal battery block. An abnormal voltage detection apparatus 200 for use in an assembled battery according to the second preferred embodiment is configured so as to be capable of outputting an abnormality detecting information signal dt2 including information indicating which battery block is abnormal.

The abnormal voltage detection apparatus 200 for use in an assembled battery according to the second preferred embodiment of the present invention will be described below with reference to FIG. 2.

Referring to FIG. 2, the assembled battery 10, the abnormal voltage detection apparatus 200 and a microcomputer 290 are all installed in an electric vehicle. The DC power of the assembled battery 10 is converted into AC power by an inverter (not shown), and the AC power drives a motor (not shown), so that the electric vehicle runs.

The abnormal voltage detection apparatus 200 includes abnormal voltage detection circuits S1 to Sn, a signal converter circuit 260 and photo-couplers PD and PR. The signal converter circuit 260 includes a level converter circuit 210, a parallel input/ serial output register 250.

The parallel input/serial output register 250 includes parallel input terminals X1 to Xn, the number of which is the same as the number (n) of the battery blocks B1 to Bn, a data output terminal DATA, a reset terminal (output command signal input terminal) RST, a grounding terminal GND and a clock oscillator 251. The grounding terminal GND is connected to the negative electrode of the lowest-order battery block B1. The voltage level of the negative electrode of the battery block B1 is referred as Vref. In the parallel input/ serial output register 250, a DC voltage obtained by converting the positive electrode voltage of the lowest-order battery block B1 using a DC/DC converter (not shown) is inputted as a drive voltage to a power supply terminal (not shown).

If one of the abnormal voltage detection circuits S1 to Sn detects voltage abnormality in the corresponding battery block, the corresponding npn transistor, one of the npn transistors Q1 to Qn serving as an output stage, turns on. In other words, if each of abnormal voltage detection circuits S1 to Sn detects the overcharged state or the over-discharged state of the corresponding battery block, it generates and outputs each of the abnormality detecting signals d1 to dn, respectively. The voltage level of the abnormality detecting signal of one of the abnormal voltage detection circuits S1 to Sn is approximately the negative electrode voltage of the corresponding battery block. The difference between the voltage level of the abnormality detecting signal dn of the highest-order abnormal voltage detection circuit Sn and the voltage level of the abnormality detecting signal d1 of the lowest-order abnormal voltage detection circuit S1 reaches several hundred volts. Therefore, if the abnormality detecting signals d1 to dn are directly inputted to the parallel input terminals X1 to Xn of the parallel input/serial output register 250, respectively, the voltage levels of the abnormality detecting signals exceed the withstand voltage limit of the input terminals of the parallel input/serial output register 250.

The level converter circuit 210 converts the voltage levels of the abnormality detecting signals d1 to dn into the input voltage levels of the parallel input terminals X1 to Xn of the parallel input/serial output register 250 provided al the subsequent stage, respectively. In the second preferred embodiment, the voltage levels are lowered to such converted voltage levels that the voltage at the negative electrode of the battery block B1 is a reference voltage Vref. The converted voltage levels for each of abnormal detecting signals d1 to dn are substantially the same as each other.

The configuration and operation of the level converter circuit 210 will be described below. The output terminal (the collector electrode of an npn transistor Q1) of the abnormal voltage detection circuit S1 is connected to the base electrode of a pnp transistor Q13. The emitter electrode of the npn transistor Q13 is connected to the positive electrode of the battery block B1, and the collector electrode thereof is connected to the negative electrode of the battery block B1 via resistors R11 and R12. The connection point of the resistors R11 and R12 is connected to the input terminal X1 of the parallel input/serial output register 250.

If the abnormal voltage detection circuit S1 detects that the battery block B1 is overcharged or over-discharged, the npn transistor Q1 turns on. The abnormal voltage detection circuit S1 outputs the abnormality detecting signal d1. A base current flows in the base electrode of the pnp transistor Q13, and the pnp transistor Q13 turns on. As a result, a High-level signal (5 V) is applied to the input terminal X1 of the parallel input/ serial output register 250.

The resistance values of the resistors R11 and R12 are selected so that the voltage at the connection point of the resistors R11 and R12 is approximately 5 V (the power supply voltage of the parallel input/serial output register 250) with respect to the ground level (the voltage at the negative electrode of the battery block B1, Vref of the parallel input/serial output register 250 when the output signal of the abnormal voltage detection circuit S1 is present.

The abnormality detecting signals d2 to dn of the abnormal voltage detection circuits S2 to Sn are also applied to the base electrodes of the pnp transistors Q23 to Qn3, respectively. The voltages at the collector electrodes of the pnp transistors Q23 to Qn3 when they are turned on are divided by resistors R21 and R22, R31 and R32, . . . and Rn1 and Rn2 so as to become approximately 5 V (the power supply voltage of the parallel input/serial output register 250) with respect to the ground level (the voltage at the negative electrode of the battery block B1, Vref1 at the input terminals X2 to Xn of the parallel input/serial output register 250, respectively. The divided voltages are applied to the corresponding input terminals X2 to Xn. The values of the resistors R11 to Rn2 are set so as to be different from each other.

When all the battery blocks B1 to Bn are normal (not overcharged or over-discharged), the corresponding pnp transistors Q13 to Qn3 remain in an off state. Therefore, the levels of all the corresponding input terminals X2 to Xn are Low.

Since a voltage of up to several hundred volts is applied to the pnp transistors Q13 to Qn3, transistors having a high withstand voltage are used for the pnp transistors.

The microcomputer 290 outputs a reset signal Sres as an output command signal to the reset terminal RST of the parallel input/serial output register 250 via the photo-coupler PR. The microcomputer 290 receives a serial output data signal, abnormality detecting information signal dt2, outputted from the parallel input/serial output register 250 via the photo-coupler PD. The microcomputer 290 is electrically insulated from the assembled battery 10 having a high voltage by the photo-couplers PD and PR.

A clock oscillator 291 is built in the microcomputer 290. The clock oscillator 251 is built in the parallel input/serial output register 250. The clock oscillators 251 and 291 start outputting clock signals having the same frequency automatically and simultaneously at the leading edge of the reset signal Sres outputted from the microcomputer 290.

The photo-coupler PD forms a first transmission device having an input terminal pair and an output terminal pair which are electrically insulated from each other. The output signal of the parallel input/serial output register 250, abnormality detecting information signal dt2, is inputted to the first transmission device and then outputted to the microcomputer 290 provided outside. The photo-coupler PR forms a second transmission device having an input terminal pair and an output terminal pair which are electrically insulated from each other. The output command signal (the reset signal Sres) from the microcomputer 290 provided outside of the abnormal voltage detection apparatus 200 is transmitted to the inside of the abnormal voltage detection apparatus 200 via the second transmission device.

The operations of the microcomputer 290 and the parallel input/serial output register 250 will be described below. The microcomputer 290 outputs the reset signal Sres. The clock oscillator 291 automatically starts outputting its clock signal at the leading edge of the reset signal Sres. The reset signal Sres is inputted to the reset terminal RST of the parallel input/serial output register 250 via the photo-coupler PR. The clock oscillator 251 automatically starts outputting its clock signal at the leading edge of the reset signal Sres outputted from the microcomputer 290.

Among the parallel input terminals X1 to Xn, the input terminal corresponding to a battery block having been detected to have voltage abnormality has High level, and the input terminals corresponding to battery blocks having not been detected to have voltage abnormality have Low level. When the reset signal Sres is inputted to the parallel input/serial output register 250, the abnormality detecting signal d1 to dn at the parallel input terminals X1 to Xn are converted into the abnormality detecting information signal dt2 at the leading edge of the reset signal (loaded to the serial output register thereof). The abnormality detecting information signal dt2 is a serial output data signal. The abnormality detecting information signal dt2 is outputted automatically from the data output terminal DATA via the photo-coupler PD at the leading edge timing of the clock signal generated from the clock oscillator 251. In other words, the parallel input/serial output register 250 starts generating and outputting of the abnormality detection information signal dt2 according to the reset signal Sres from the photo-coupler PR.

The abnormality detecting information signal dt2 has data bits, the number of which is at least the same as the number "n" of the battery blocks. A data bit has High level at the leading edge timing of the clock signal corresponding to the battery block having been detected to have abnormality.

When no abnormality detecting information signal dt2 is outputted, the data output terminal DATA has Low level. The detection signal outputted from the data output terminal DATA, corresponding to a battery block that is normal in voltage, has Low level.

After a predetermined clock period such as one clock period of the clock oscillator 251 or the like has passed from the leading edge of the reset signal, the abnormality detecting information signal dt2 is outputted from the data output terminal DATA at the leading edge of the clock signal from the clock oscillator 251.

The microcomputer 290 is driven by a low-voltage power source (not shown), such as a lead-acid battery having a nominal voltage of 12 V, via a DC/DC converter that converts 12 V into 5 V. The abnormality detection information signal dt2 serving as the output signal of the abnormal voltage detection apparatus 200 is inputted to the microcomputer 290 via the photo-coupler PD. After a predetermined clock period, such as one clock period of the clock oscillator 251 or the like, has passed from the leading edge of the reset signal, the serial output data signal is inputted at the falling edge of the clock signal from the clock oscillator 291.

The clock oscillators 251 and 291 have the same oscillation start timing and the same oscillation frequency, and the parallel input/serial output register 250 and the microcomputer 290 operate in synchronization with each other. Therefore, the microcomputer 290 can accurately capture the serial output data signal.

Start bits and/or stop bits can be added to the beginning and end of the abnormality detecting information signal dt2. For example, the abnormality detecting information signal dt2 has 40 start bits, data bits, the number of which is at least the same as the number "n" of the battery blocks, and 40 stop bits in this order.

The start bits include 39 High-level bits and one Low-level bit, for example. The stop bits include one Low-level bit and 39 High-level bits. The start bits and the stop bits are used so that the microcomputer 290 identifies the start and end of data transmission. When the number of the data bits is not more than 38 and that 39 High-level bits continue, the microcomputer 290 can judge that the bits are the start bits or the stop bits.

The number of the start bits may be changed so as to be different from that of the stop bits. With this change, the microcomputer 290 can easily identify the start bits and the stop bits.

As described above, the microcomputer 290 transmits the reset signal Sres to the abnormal voltage detection apparatus 200 and receives the abnormality detecting information signal dt2 at predetermined timing, and judges whether the battery blocks B1 to Bn have been overcharged or over-discharged based on the abnormality detecting information signal dt2. Since the microcomputer 290 can identify a battery block that has been overcharged or over-discharged, the microcomputer 290 can control the identified battery block such as only the battery block judged to have been overcharged is discharged and/or only the battery block judged to have been over-discharged is charged.

The abnormal voltage detection apparatus for use in an assembled battery according to the second preferred embodiment uses only two insulating devices (photo-couplers) that are large in size and expensive. Therefore, the abnormal voltage detection apparatus for use in an assembled battery according to the second preferred embodiment of the present invention is small in size and inexpensive.

The configuration of the level converter circuit 210 is not limited to the circuit configuration shown in FIG. 2. The level converter circuit 210 may be configured so that the ground level of the parallel input/serial output register 250 is set at the negative electrode voltage of the highest-order battery block Bn and so that the output voltage levels of the respective abnormal voltage detection circuits are raised to such voltage levels that the voltage at the negative electrode of the battery block Bn is used as a reference voltage, and inputted to the parallel input terminals X1 to Xn.

The level converter circuit 210 may be also configured so that the ground level of the parallel input/serial output register 250 is set at the negative electrode voltage of any given battery block and so that the output voltage levels of the respective abnormal voltage detection circuits are raised or lowered, and inputted to the parallel input terminals X1 to Xn.

In the above-mentioned configuration, each of the voltage levels of the abnormality detecting signals d1 to dn is divided using resistors. However, the voltage level may be also divided by using means that does not use resistors such as a constant voltage lowering circuit or the like.

Third Preferred Embodiment

Figure 3:
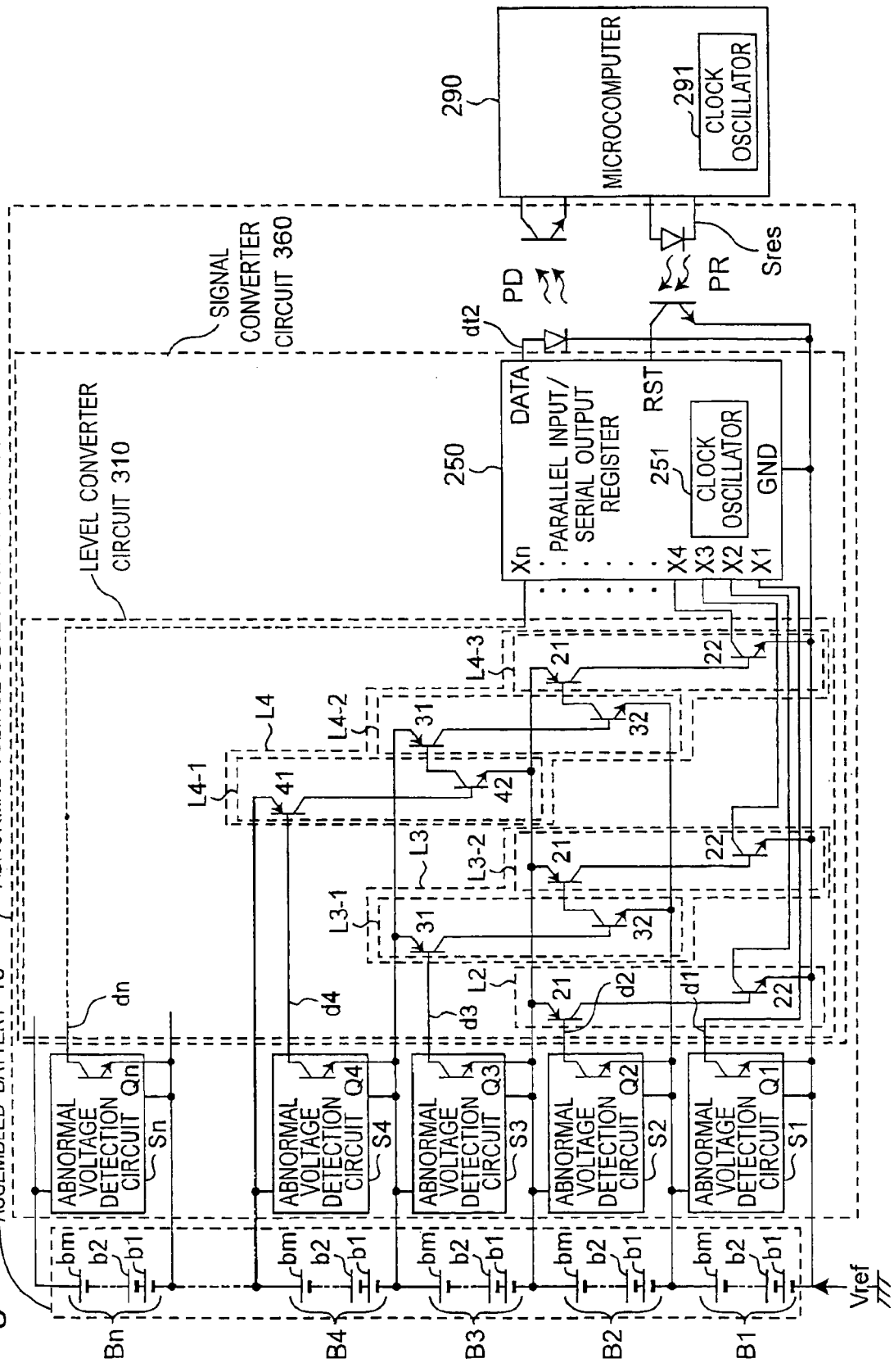
FIG. 3 is a block diagram showing a schematic configuration of an abnormal voltage detection apparatus for use in an assembled battery according to a third preferred embodiment of the present invention.

FIG. 3 is a block diagram showing a schematic configuration of the abnormal voltage detection apparatus for use in an assembled battery according to the third preferred embodiment of the present invention. In FIG. 3, components common to those shown in FIG. 2 are designated by common numerals, and their descriptions are omitted. An abnormal voltage detection apparatus 300 according to the third preferred embodiment has such a configuration that the signal converter circuit 260 of the abnormal voltage detection circuits 200 of FIG. 2 according to the second preferred embodiment is replaced with a signal converter circuit 360. The signal converter circuit 360 has such a configuration that the level converter circuit 210 is replaced with a level converter circuit 310. In other respects, the configuration is the same as that of the abnormal voltage detection apparatus 200 according to the second preferred embodiment.

In the abnormal voltage detection apparatus 200 for use in an assembled battery according to the second preferred embodiment, the level converter circuit 210 is configured using pnp transistors Q13 to Qn3 having a high withstand voltage. In the abnormal voltage detection apparatus 300 for use in an assembled battery according to the third preferred embodiment, the level converter circuit is configured without using devices having a high withstand voltage.

The abnormal voltage detection apparatus 300 for use in an assembled battery according to the third preferred embodiment of the present invention will be described below with reference to FIG. 3.

Referring to FIG. 3, the assembled battery 10, the abnormal voltage detection apparatus 300 and the microcomputer 290 are all installed in an electric vehicle. The DC power of the assembled battery 10 is converted into AC power by an inverter (not shown), and the AC power drives a motor (not shown), so that the electric vehicle runs.

In the third preferred embodiment, each of the parallel input terminals X1 to Xn of the parallel input/serial output register 250 has High level when the voltage of the corresponding battery block is normal. However, each of the input terminals has Low level when the voltage of the corresponding battery block is abnormal. The levels are opposite to those in the second preferred embodiment.

The configuration and operation of the level converter circuit 310 will be described below. The level converter circuit 310 has level lowering circuits L2, L3, . . . and Ln. The level lowering circuits L2, L3, . . . and Ln convert the voltage levels of the abnormality detecting signals d2, d3, and dn into the input voltage levels such as 5 V of the parallel input terminals X2, X3, . . . and Xn of the parallel input/serial output register 250 provided at the subsequent stage, respectively.

In the third preferred embodiment, the output signal of the lowest-order abnormal voltage detection circuit SI, the abnormality detecting signal d1, is directly inputted to the input terminal X1 (without being subjected to level conversion). Only the level lowering circuits L2, L3, and L4 are shown in FIG. 3.

The level lowering circuit L2 includes a pnp transistor 21 and an npn transistor 22. The base electrode of the pnp transistor 21 is connected to the output terminal (the collector electrode of the npn transistor Q2) of the abnormal voltage detection circuit S2 and serves as the input terminal of the level lowering circuit L2. The emitter electrode of the pnp transistor 21 is connected to the positive electrode of the battery block B2, and the collector electrode thereof is connected to the base electrode of the npn transistor 22. The emitter electrode of the npn transistor 22 is connected to the negative electrode of the battery block B1. The collector electrode of the npn transistor 22 is connected to the input terminal X2 of the parallel input/serial output register 250 and serves as the output terminal of the level lowering circuit L2.

The level lowering circuit L3 includes two pairs L3-1 and L3-2 of pnp and npn transistors. Hereinafter, the pair of an npn transistor and a pnp transistor is referred to as a pair. The pair L3-1 includes a pnp transistor 31 and an npn transistor 32. The pair L3-2 includes a pnp transistor 21 and an npn transistor 22. The pair L3-2 has the same configuration as that of the level lowering circuit L2. The base electrode of the pnp transistor 31 is connected to the output terminal (the collector electrode of the npn transistor Q3) of the abnormal voltage detection circuit S3 and serves as the input terminal of the level lowering circuit L3. The emitter electrode of the pnp transistor 31 is connected to the positive electrode of the battery block B3, and the collector electrode thereof is connected to the base electrode of the npn transistor 32.

The emitter electrode of the npn transistor 32 is connected to the negative electrode of the battery block B2, and the collector electrode thereof is connected to the base electrode of the pnp transistor 21 of the pair L3-2. The emitter electrode of the pnp transistor 21 is connected to the positive electrode of the battery block B2, and the collector electrode thereof is connected to the base electrode of the npn transistor 22. The emitter electrode of the npn transistor 22 is connected to the negative electrode of the battery block B1. The collector electrode of the npn transistor 22 of the pair L3-2 is connected to the input terminal X3 of the parallel input/serial output register 250 and serves as the output terminal of the level lowering circuit L3.

The level lowering circuit L4 includes three pairs L4-1, L4-2 and L4-3 of pnp and npn transistors. The pair L4-1 includes a pnp transistor 41 and an npn transistor 42. The pair L4-2 includes a pnp transistor 31 and an npn transistor 32. The pair L4-2 has the same configuration as that of the pair L3-1. The pair L4-3 includes a pnp transistor 21 and an npn transistor 22. The pair L4-3 has the same configuration as that of the level lowering circuit L2. The base electrode of the pnp transistor 41 is connected to the output terminal (the collector electrode of the npn transistor Q4) of the abnormal voltage detection circuit S4 and serves as the input terminal of the level lowering circuit L4. The emitter electrode of the pnp transistor 41 is connected to the positive electrode of the battery block B4, and the collector electrode thereof is connected to the base electrode of the npn transistor 42.

The emitter electrode of the npn transistor 42 is connected to the negative electrode of the battery block B3, and the collector electrode thereof is connected to the base electrode of the pnp transistor 31 of the pair L4-2. The emitter electrode of the pnp transistor 31 is connected to the positive electrode of the battery block B3, and the collector electrode thereof is connected to the base electrode of the npn transistor 32. The emitter electrode of the npn transistor 32 is connected to the negative electrode of the battery block B2, and the collector electrode thereof is connected to the base electrode of the prip transistor 21 of the pair L4-3. The emitter electrode of the pnp transistor 21 is connected to the positive electrode of the battery block B2, and the collector electrode thereof is connected to the base electrode of the npn transistor 22. The emitter electrode of the npn transistor 22 is connected to the negative electrode of the battery block B1. The collector electrode of the npn transistor 22 is connected to the input terminal X4 of the parallel input/serial output register 250 and serves as the output terminal of the level lowering circuit L4.

In a similar way, the k-th level lowering circuit Lk (2≦k≦n) includes (k-1) pairs of npn and pnp transistors. The input terminal of the level lowering circuit Lk is connected to the output terminal of the abnormal voltage detection circuit Sk. The base electrode of the pnp transistor of the first pair is connected to the output terminal (the collector electrode of the npn transistor Qk) of the abnormal voltage detection circuit Sk and serves as the input terminal of the level lowering circuit Lk.

The emitter electrode of the pnp transistor of the first pair is connected to the positive electrode of the battery block Bk, and the collector electrode thereof is connected to the base electrode of the npn transistor of the first pair. The emitter electrode of the npn transistor the first pair is connected to the negative electrode of the battery block B(k-1), and the collector electrode thereof is connected to the base electrode of the pnp transistor of the second pair. The emitter electrode of the pnp transistor of the second pair is connected to the positive electrode of the battery block B(k-1), and the collector electrode thereof is connected to the base electrode of the npn transistor of the second pair.

The emitter electrode of the npn transistor of the second pair is connected to the negative electrode of the battery block B(k-2). The collector electrode thereof is connected to the base electrode of the pnp transistor of the third pair. The emitter electrode of the pnp transistor of the their pair is connected to the positive electrode of the battery block B(k-2), and the collector electrode thereof is connected to the base electrode of the npn transistor of the third pair. The emitter electrode of the npn transistor of the third pair is connected to the negative electrode of the battery block B(k-3). This is repeated hereinafter.

In the end, the emitter electrode of the npn transistor of the last pair is connected to the negative electrode of the battery block B1. The collector electrode of the npn transistor of the last pair is connected to the input terminal Xk of the parallel input/serial output register 250 and serves as the output terminal of the level lowering circuit Lk.

The operation of the level lowering circuit L2 will be described below. When the abnormal voltage detection circuit S2 detects abnormality of the battery block B2, the base current of the pnp transistor 21 flows in the input terminal (the base electrode of the pnp transistor 21) of the level lowering circuit L2, and the pnp transistor 21 turns on. Therefore, a current flows in the base electrode of the npn transistor 22, and the npn transistor 22 also turns on. The collector electrode voltage of the npn transistor 22 (the output terminal voltage of the level lowering circuit L2) lowers to a voltage close to the negative electrode voltage of the lowest-order battery block B1. In other words, the voltage level of the input terminal X2 of the parallel input/serial output register 250 becomes Low level of such a state that there is an input signal.

When the abnormal voltage detection circuit S2 does not detect abnormality of the battery block B2, the base current of the pnp transistor 21 does not flow in the input terminal (the base electrode of the pnp transistor 21) of the level lowering circuit L2, and the pnp transistor 21 is turned off. Therefore, the npn transistor 22 is also turned off. The voltage level of the input terminal X2 of the parallel input/serial output register 250 becomes High level.

As described above, when the level lowering circuit L2 has an input signal, it converts the voltage level of the abnormality detecting signal d2 into the ground level (the negative electrode voltage of the lowest-order battery block B1) of the parallel input/serial output register 250, and outputs the obtained signal to the input terminal X2 of the parallel input/serial output register 250. The level lowering circuit L2 converts the voltage level of the abnormality detecting signal d2 into the converted voltage level by a circuit including pnp transistor 21 and npn transistor 22, utilizing voltage differences each between electrodes of each transistor.

The operation of the level lowering circuit L3 will be described below. When the abnormal voltage detection circuit S3 detects abnormality of the battery block B3, the base current of the pnp transistor 31 flows in the input terminal (the base electrode of the pnp transistor 31) of the level lowering circuit L3, and the pnp transistor 31 turns on. Therefore, a current flows in the base electrode of the npn transistor 32, and the npn transistor 32 also turns on. A current flows in the base electrode of the pnp transistor 21 of the pair L3-2, and the pnp transistor 21 of the pair L3-2 turns on. Therefore, the collector electrode voltage of the npn transistor 22 of the pair L3-2 (the output terminal voltage of the level lowering circuit L3) lowers to a voltage close to the negative electrode voltage of the lowest-order battery block B1. In other words, the voltage level of the input terminal X3 of the parallel input/serial output register 250 becomes Low level of such a state that there is an input signal.

When the abnormal voltage detection circuit S3 does not detect abnormality of the battery block B3, the base current of the pnp transistor 31 does not flow in the input terminal (the base electrode of the pnp transistor 31) of the level lowering circuit L3, and the pnp transistor 31 is turned off. Therefore, the npn transistor 32, the pnp transistor 21 and the npn transistor 22 of the pair L3-2 are also turned off. The voltage level of the input terminal X3 of the parallel input/serial output register 250 becomes High level.

As described above, in the level lowering circuit L3, the voltage level of the input signal, the abnormality detecting signal d3, is lowered to a voltage level close to the negative electrode voltage of the battery block B2 by the pair L3-1 of pnp transistor 31 and the npn transistor 32. The lowered voltage level is further lowered into a voltage level close to the negative electrode voltage of the battery block B1 by the pair L3-2 of pnp transistor 21 and the npn transistor 22. The obtained signal is outputted to the parallel input/serial output register 250. In other words, when the level lowering circuit L3 has an input signal (the abnormality detecting signal d3) it converts the voltage level of the input signal into the ground level (the negative electrode voltage of the lowest-order battery block B1) of the parallel input/serial output register 250, and outputs the obtained signal to the input terminal X3 of the parallel input/serial output register 250. The level lowering circuit L3 converts the voltage level of the abnormality detecting signal d3 stepwise by a unit voltage into the converted voltage level by a circuit including pnp transistors 21 and 31 and npn transistors 22 and 32, utilizing voltage differences each between electrodes of each transistor. The unit voltage is a voltage between the terminals of each of battery blocks B1 and B2.

The subsequent level lowering circuits L4 to Ln also operate similarly. By using one pair of pnp and npn transistors, the voltage level of the output signal of the corresponding abnormal voltage detection circuit is lowered by the voltage (14.4 V in the present preferred embodiment) between the terminals of one battery block. The voltage level of each of the output signals d1 to dn of the respective abnormal voltage detection circuits S1 to Sn is lowered stepwise by a voltage between the terminals of the battery block. In the end, the voltage levels of the output signals d1 to dn are converted into such converted voltage levels that the negative electrode of the lowest-order battery block B1 is used as a reference voltage, and then the obtained signals are outputted. The level lowering circuit Lk lowers the voltage level of the inputted abnormality detecting signal dk stepwise by a unit voltage to convert the voltage level thereof into the converted voltage level. The unit voltage is a voltage between the terminals of each of battery blocks B1 to Bn.

The voltage applied to each of the pnp and npn transistors constituting the level converter circuit 310 is approximately the voltage (14.4 V) between the terminals of one battery block or approximately twice the voltage (28.8 V). Therefore, the level converter circuit 310 can easily be integrated into an IC using existing semiconductor devices having a low withstand voltage of approximately 40 V. With the third preferred embodiment, an abnormal voltage detection apparatus for use in an assembled battery, being inexpensive and small, can be provided.

Fourth Preferred Embodiment

FIG. 4 is a block diagram showing a schematic configuration of the abnormal. voltage detection apparatus for use in an assembled battery according to the fourth preferred embodiment of the present invention. In FIG. 4, components common to those shown in FIG. 3 are designated by common numerals, and their descriptions are omitted. An abnormal voltage detection apparatus 400 according to the fourth preferred embodiment has such a configuration that the signal converter circuit 360 of the abnormal voltage detection circuits 300 of FIG. 3 according to the third preferred embodiment is replaced with a signal converter circuit 460. The signal converter circuit 460 has such a configuration that the level converter circuit 310 is replaced with a level converter circuit 410. In other respects, the configuration is the same as that of the abnormal voltage detection apparatus 300 according to the third preferred embodiment.

In the level converter circuit 310 of the third preferred embodiment, the voltage between the terminals of each of battery blocks B1 to Bn is used as the unit voltage. Each of the level lowering circuits lowers the voltage level of the inputted abnormality detecting signal stepwise by the unit voltage to convert the voltage level thereof into the converted voltage level. The level converter circuit 410 of the fourth preferred embodiment includes level lowering circuits each of which lowers the voltage level of the inputted abnormality detecting signal by a plurality of unit voltages to convert the voltage level thereof into the converted voltage level.

The abnormal voltage detection apparatus 400 for use in an assembled battery according to the fourth preferred embodiment of the present invention will be described below with reference to FIG. 4.

Referring FIG. 4, the assembled battery 10, the abnormal voltage detection apparatus 400 and the microcomputer 290 are all installed in an electric vehicle. The DC power of the assembled battery 10 is converted into AC power by an inverter (not shown), and the AC power drives a motor (not shown), so that the electric vehicle runs.

The configuration and operation of the level converter circuit 410 will be described below. The level converter circuit 410 has level lowering circuits L2, L300, L400, L500, ... and Ln00. The level lowering circuits L2, L300, L400, L500, ... and Ln00, convert the voltage levels of abnormality detecting signals d2, d3, d4, d5 ... and dn into the input voltage levels such as 5 V of the parallel input terminals X2, X3, X4, X5 ... and Xn of the parallel input/serial output register 250 provided at the subsequent stage, respectively. Only the level lowering circuits L2, L300, L400 and L500 are shown in FIG. 4.

The level lowering circuit L2 has the same configuration as that of the level lowering circuit L2 of the level converter circuit 310 (FIG. 3) and its description is omitted. The level lowering circuit L2 forms a first level lowering circuit for lowering the voltage level of the abnormality detecting signal d2 for the battery block B2 only by an unit voltage, to convert the voltage level thereof into the converted voltage level.

The level lowering circuit L300 includes a pnp transistor 51 and an npn transistor 52. The base electrode of the pnp transistor 51 is connected to the output terminal (the collector electrode of the npn transistor Q3) of the abnormal voltage detection circuit S3 and serves as the input terminal of the level lowering circuit L300. The emitter electrode of the pnp transistor 51 is connected to the positive electrode of the battery block B3, and the collector electrode thereof is connected to the base electrode of the npn transistor 52. The emitter electrode of the npn transistor 52 is connected to the negative electrode of the battery block B1. The collector electrode of the npn transistor 52 is connected to the input terminal X3 of the parallel input/serial output register 250 and serves as the output terminal of the level lowering circuit L300.

The level lowering circuit L400 includes two pairs L4-4 and L4-5 of pnp and npn transistors. The pair L4-4 includes a pnp transistor 61 and an npn transistor 62. The pair L4-5 includes a pnp transistor 21 and an npn transistor 22. The pair L4-5 has the same configuration as that of the level lowering circuit L2. The base electrode of the pnp transistor 61 is connected to the output terminal (the collector electrode of the npn transistor Q4) of the abnormal voltage detection circuit S4 and serves as the input terminal of the level lowering circuit L400. The emitter electrode of the pnp transistor 61 is connected to the positive electrode of the battery block B4, and the collector electrode thereof is connected to the base electrode of the npn transistor 62.

The emitter electrode of the npn transistor 62 is connected to the negative electrode of the battery block B2, and the collector electrode thereof is connected to the base electrode of the pnp transistor 21 of the pair L4-5. The emitter electrode of the pnp transistor 21 of the pair L4-5 is connected to the positive electrode of the battery block B2, and the collector electrode thereof is connected to the base electrode of the npn transistor 22 of the pair L4-5. The emitter electrode of the npn transistor 22 of the pair L4-5 is connected to the negative electrode of the battery block B1. The collector electrode of the npn transistor 22 of the pair L4-5 is connected to the input terminal X4 of the parallel input/serial output register 250 and serves as the output terminal of the level lowering circuit L400.

The level lowering circuit L500 includes two pairs L5-1 and L5-2 of pnp and npn transistors. The pair L5-1 includes a pnp transistor 71 and an npn transistor 72. The pair L5-2 includes a pnp transistor 51 and an npn transistor 52. The pair L5-2 has the same configuration as that of the level lowering circuit L300. The base electrode of the pnp transistor 71 is connected to the output terminal (the collector electrode of the npn transistor Q5) of the abnormal voltage detection circuit S5 and serves as the input terminal of the level lowering circuit L500. The emitter electrode of the pnp transistor 71 is connected to the positive electrode of the battery block B5, and the collector electrode thereof is connected to the base electrode of the npn transistor 72.

The emitter electrode of the npn transistor 72 is connected to the negative electrode of the battery block B3, and the collector electrode thereof is connected to the base electrode of the pnp transistor 51 of the pair L5-2. The emitter electrode of the pnp transistor 51 is connected to the positive electrode of the battery block B3, and the collector electrode thereof is connected to the base electrode of the npn transistor 52 of the pair L5-2. The emitter electrode of the npn transistor 52 of the pair L5-2 is connected to the negative electrode of the battery block B1. The collector electrode of the npn transistor 52 of the pair L5-2 is connected to the input terminal X5 of the parallel input/serial output register 250 and serves as the output terminal of the level lowering circuit L500.

The operation of the level lowering circuit L300 will be described below. When the abnormal voltage detection circuit S3 detects abnormality of the battery block B3, the base current of the pnp transistor 51 flows in the input terminal (the base electrode of the pnp transistor 51) of the level lowering circuit L300, and the pnp transistor 51 turns on. Therefore, a current flows in the base electrode of the npn transistor 52, and the npn transistor 52 also turns on. The collector electrode voltage of the npn transistor 52 (the output terminal voltage of the level lowering circuit L300) lowers to a voltage close to the negative electrode voltage of the lowest-order battery block B1. In other words, the voltage level of the input terminal X3 of the parallel input/ serial output register 250 becomes Low level of a state that there is an input signal.

When the abnormal voltage detection circuit S3 does not detect abnormality of the battery block B3, the base current of the pnp transistor 51 does not flow in the input terminal (the base electrode of the pnp transistor 51) of the level lowering circuit L300, and the pnp transistor 51 is turned off. Therefore, the npn transistor 52 is also turned off. The voltage level of the input terminal X3 of the parallel input/serial output register 250 becomes High level.

As described above, when the level lowering circuit L300 has an input signal, it converts the voltage level of the input signal into the ground level (the negative electrode voltage of the lowest-order battery block B1) of the parallel input/serial output register 250, and outputs the obtained signal to the input terminal X3 of the parallel input/serial output register 250. The level lowering circuit L300 forms a second level lowering circuit, which includes pnp transistor 51 and npn transistor 52 and utilizes voltage differences each between electrodes of each transistors. The level lowering circuit L300 lowers the voltage level of the abnormality detecting signal d3 for the battery block B3 by twice the voltage across the battery block, to convert the voltage level thereof into the converted voltage level.

The operation of the level lowering circuit L400 will be described below. When the abnormal voltage detection circuit S4 detects abnormality of the battery block B4, the base current of the pnp transistor 61 flows in the input terminal (the base electrode of the pnp transistor 61) of the level lowering circuit L400, and the pnp transistor 61 turns on. Therefore, a current flows in the base electrode of the npn transistor 62, and the npn transistor 62 also turns on. A current flows in the base electrode of the pnp transistor 21 of the pair L4-5, and the pnp transistor 21 of the pair L4-5 turns on. Therefore, the collector electrode voltage of the npn transistor 22 of the pair L4-5 (the output terminal voltage of the level lowering circuit L400) lowers to a voltage close to the negative electrode voltage of the lowest-order battery block B1. In other words, the voltage level of the input terminal X4 of the parallel input/serial output register 250 becomes Low level of a state that there is an input signal.

When the abnormal voltage detection circuit S4 does not detect abnormality of the battery block B4, the base current of the pnp transistor 61 does not flow in the input terminal (the base electrode of the pnp transistor 61) of the level lowering circuit L400, and the pnp transistor 61 is turned off. Therefore, the npn transistor 62, the pnp transistor 21 and the npn transistor 22 of the pair L4-5 are also turned off. The voltage level of the input terminal X4 of the parallel input/serial output register 250 becomes High level.

As described above, in the level lowering circuit L400, the voltage level of the input signal is converted into a voltage level close to the negative electrode voltage of the battery block B2 by the pair L4-4 of pnp transistor 61 and the npn transistor 62. The voltage level is further converted into a voltage level close to the negative electrode voltage of the battery block B 1 by the pair L4-5 of pnp transistor 21 and the npn transistor 22. The obtained signal is outputted to the parallel input/serial output register 250. In other words, when the level lowering circuit L400 has an input signal, it converts the voltage level of the input signal into the ground level (the negative electrode voltage of the lowest-order battery block B1) of the parallel input/serial output register 250, and outputs the obtained signal to the input terminal X4 of the parallel input/serial output register 250. The level lowering circuit L400 forms a third level lowering circuit, which includes pnp transistors 61 and 21 and npn transistors 62 and 22 and utilizes voltage differences each between electrodes of each transistors. The level lowering circuit L400 lowers the voltage level of the abnormality detecting signal d4 for the battery block B4 by twice of the unit voltages and then lowers a lowered voltage level thereof by the unit voltage to convert the voltage level thereof into the converted voltage level.

The operation of the level lowering circuit L500 will be described below. When the abnormal voltage detection circuit S5 detects abnormality of the battery block B5, the base current of the pnp transistor 71 flows in the input terminal (the base electrode of the pnp transistor 71) of the level lowering circuit L500, and the pnp transistor 71 turns on Therefore, a current flows in the base electrode of the npn transistor 72, and the npn transistor 72 also turns on. A current flows in the base electrode of the pnp transistor 51 of the pair L5-2, and the pnp transistor 51 of the pair L5-2 turns on. Therefore, the collector electrode voltage of the npn transistor 52 of the pair L5-2 (the output terminal voltage of the level lowering circuit L500) lowers to a voltage close to the negative electrode voltage of the lowest-order battery block B1. In other words, the voltage level of the input terminal X5 of the parallel input/serial output register 250 becomes Low level of a state that there is an input signal.

When the abnormal voltage detection circuit S5 does not detect abnormality of the battery block B5, the base current of the pnp transistor 71 does not flow in the input terminal (the base electrode of the pnp transistor 71) of the level lowering circuit L400, and the pnp transistor 71 is turned off. Therefore, the npn transistor 72, the pnp transistor 51 and the npn transistor 52 of the pair L5-2 are also turned off. The voltage level of the input terminal X5 of the parallel input/serial output register 250 becomes High level.

As described above, in the level lowering circuit L500, the voltage level of the input signal is converted into a voltage level close to the negative electrode voltage of the battery block B3 by the pair L5-1 of pnp transistor 71 and the npn transistor 72. The lowered voltage level is further converted into a voltage level close to the negative electrode voltage of the battery block B1 by the pair L5-2 of the pnp transistor 51 and the npn transistor 52. The obtained signal is outputted to the parallel input/serial output register 250. In other words, when the level lowering circuit L500 has an input signal, it converts the voltage level of the input signal into the ground level (which is the negative electrode voltage of the lowest-order battery block B1) of the parallel input/serial output register 250, and outputs the obtained signal to the input terminal X5 of the parallel input/serial output register 250.

The subsequent level lowering circuits L600 to Ln00 also operate similarly. By using pairs of pnp and npn transistors, the voltage level of the output signal of the corresponding abnormal voltage detection circuit is lowered by the voltage (14.4 V in the preferred embodiment) between the terminals of one battery block or two battery blocks. The voltage levels of the output signals of the respective abnormal voltage detection circuits are lowered sequentially by the voltage between the terminals of one battery block or two battery blocks. In the end, the voltage levels of the output signals are converted into such levels the negative electrode of the lowest-order battery block B1 is used as a reference voltage, and then the obtained signals are outputted.

The voltage applied to each of the pnp and npn transistors constituting the level converter circuit 410 is approximately the voltage (14.4 V) between the terminals of one battery block or approximately twice the voltage (28.8 V) or three times the voltage (43.2 V). Therefore, the level converter circuit 410 can easily be integrated into an IC using existing semiconductor devices having a relatively low withstand voltage of approximately 50 V. With the fourth preferred embodiment, an abnormal voltage detection apparatus for use in an assembled battery, being inexpensive and small, can be provided.

The configuration of the level converter circuit 410 is not limited to that shown in FIG. 4. In the level lowering circuit Lk00 according to the fourth preferred embodiment, the voltage level of the input signal is lowered by the voltage between the terminals of one battery block (14.4 V) Or two battery blocks (28.8 V). Instead of this value, in the high-order level lowering circuit Lk00, the voltage level of the input signal may be also lowered by three times the voltage between the terminals of the battery block. However, the decrement for the voltage level is determined by the trade-off between the withstand voltage level of the pnp and npn transistors constituting the level lowering circuit Lk00 and the voltage between the terminals of the battery block.

In the second, third and fourth preferred embodiments, the serial output data signal (abnormality detection signal) transmitted from the abnormal voltage detection apparatus to the microcomputer has data bits corresponding to the battery blocks. However, the format of the serial output data signal is not limited to this. The serial output data signal may include information capable of identifying abnormal (or normal) battery blocks. For example, numbers for identifying abnormal battery blocks may be also included in the serial output data signal.

Not only a photo-coupler but also any appropriate device can be used as a transmission device, having an input terminal pair and an output terminal pair which are electrically insulated from each other. It is thus possible to use, for example, a combination of a magnetism generating circuit and a magnetism detection device, and a transformer, the primary and secondary windings of which are electrically insulated from each other. Since the transformer cannot transmit DC components, a method for transmitting essential data and complementary data in series, for example, is used. When the abnormal voltage detection apparatus according to the present invention is installed in an electric vehicle, a photo-coupler not affected by disturbance, such as magnetism, is used. Furthermore, a photo-coupler, the light-emitting diode and the phototransistor of which are accommodated in separate packages (not integrated into one unit), is used preferably.

Each cell of the assembled battery 10 may be a battery other than a nickel-hydrogen battery. For example, the assembled battery 10 may be formed of lead-acid batteries, nickel-cadmium batteries or lithium-ion secondary batteries.

The abnormal voltage detection apparatus for use in an assembled battery according to all the preferred embodiments may be configured as a part of a battery ECU (electronic control unit) constituting a battery pack system and carrying out output control on the basis of the state of the assembled battery 10.

The abnormal voltage detection apparatus for use in an assembled battery according to all the preferred embodiments is installed in electric vehicles. However, the abnormal voltage detection apparatus may be also installed in apparatuses other than electric vehicles, such as an apparatus that is driven by using an assembled battery as a power source. In the abnormal voltage detection apparatus for use in an assembled battery according to the present invention, the larger the number of the battery blocks constituting the assembled battery is, the higher the effect of reducing cost and circuit size is.

In the above-mentioned preferred embodiments, the pnp and npn transistors may be replaced with other switching devices, respectively. In the above-mentioned embodiments, N-channel MOS field effect transistors and P-channel MOS field effect transistors may be used instead of npn transistors and pnp transistors.

The present invention has such an advantageous effect as being capable of realizing an abnormal voltage detection apparatus for use in an assembled battery, being small in size and inexpensive. The abnormal voltage detection apparatus detects voltage abnormality in battery blocks each of which includes at least one secondary battery being connected in series to each other.

The abnormal voltage detection apparatus for use in an assembled battery according to the present invention is useful for use in electric vehicles, such as pure electric vehicles (PEVs), hybrid electric vehicles (HEVs) and hybrid vehicles having fuel cells and secondary batteries.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An abnormal voltage detection apparatus for use in an assembled battery comprising a plurality of battery blocks connected in series to each other, said abnormal voltage detection apparatus detecting voltage abnormality in said assembled battery, each battery block comprising at least one secondary battery, said abnormal voltage detection apparatus comprising:

a plurality of signal detectors each provided in each of said battery blocks, each of said signal detectors:
  detecting either one of voltage abnormality and normality of said each battery block based on a voltage of said each battery block,
  generating an abnormality detecting signal containing information about either detected one of the voltage abnormality and normality, and
  outputting the abnormality detecting signal, wherein said signal detectors simultaneously detect the respective voltages of said battery blocks;

a signal generator connected with the plurality of signal detectors to receive the abnormality detecting signals, the signal generator generating an abnormality detecting information signal containing information about whether or not a voltage abnormality is present in any of said battery blocks based on the abnormality detecting signals; and a first transmission device directly connected to the abnormality detecting information signal generated by the signal generator, the first transmission device having an input terminal pair and an output terminal pair which are electrically insulated from each other, said first transmission device transmitting the abnormality detecting information signal to an external apparatus, wherein the abnormality detecting information signal turns the first transmission device on when any of said battery blocks has a voltage abnormality and wherein the abnormality detecting information signal turns the first transmission device off when none of the plurality of signal detectors detect voltage abnormality in the battery blocks.

2. The abnormal voltage detection apparatus as claimed in claim 1,
wherein said signal generator calculates a logical sum of the abnormality detecting signals, and generates an abnormality detecting information signal containing a calculated logical sum as information about whether or not any of said battery blocks in the voltage abnormality is present.

3. An abnormal voltage detection apparatus for use in an assembled battery comprising a plurality of battery blocks connected in series to each other, said abnormal voltage detection apparatus detecting voltage abnormality in said assembled battery, each battery block comprising at least one secondary battery, said abnormal voltage detection apparatus comprising:

a plurality of signal detectors connected, one of the plurality of signal detectors provided in each of said battery blocks, each of said signal detectors:
  detecting either one of voltage abnormality and normality of said each battery block based on a voltage of said each battery block, wherein voltage abnormality of a particular battery block is detected when the detected voltage of the particular battery block is above a first voltage or below a second voltage lower than the first voltage,
  generating an abnormality detecting signal containing information about the voltage abnormality and normality based on the detected voltages of the battery blocks, and
  outputting the abnormality detecting signal, wherein said signal detectors simultaneously detect the respective voltages of said battery blocks;

a signal converter connected to the abnormality detecting signal output by the plurality of signal detectors, the signal converter generating and outputting an abnormality detecting information signal containing information about the abnormality detecting signals based on the respective abnormality detecting signals; and a first transmission device connected to the abnormality detecting information signal, the first transmission device having an input terminal pair and an output terminal pair which are electrically insulated from each other, said first transmission device transmitting the abnormality detecting information signal to an external apparatus, wherein the abnormality detecting information signal controls output levels of the first transmission device.

4. The abnormal voltage detection apparatus as claimed in claim 3,
wherein a plurality of the abnormality detecting signals are parallel signals, and the abnormality detecting information signal is a serial signal, and
wherein said signal converter comprises a parallel-serial converter for converting a plurality of the abnormality detecting signals into the abnormality detecting information signal, and outputting the abnormality detecting information signal, wherein the serial signal identifies which battery block has an abnormal voltage.

5. The abnormal voltage detection apparatus as claimed in claim 4,
wherein said signal converter comprises a level converter provided at a former stage of said parallel-serial converter, said level converter converting a voltage level of each of the abnormality detecting signals into each of converted voltage levels, and outputting the abnormality detecting signals each having the converted voltage level.

6. The abnormal voltage detection apparatus as claimed in claim 5,
wherein the converted voltage levels are substantially the same as each other, and
wherein said level converter converts the voltage level of each of the abnormality detecting signals into each of the converted voltage levels, respectively, by resistance voltage division circuits.

7. The abnormal voltage detection apparatus as claimed in claim 5,
wherein the converted voltage levels are substantially the same as each other, and
wherein said level converter converts the voltage level of each of the abnormality detecting signals into each of the converted voltage levels, respectively, by level converter circuits each including transistors and each utilizing voltage differences each between electrodes of each transistor.

8. The abnormal voltage detection apparatus as claimed in claim 5,
wherein the converted voltage levels are substantially the same as each other, and
wherein said level converter converts the voltage level of at least one of the abnormality detecting signals into each of the converted voltage levels, respectively, by level converter circuits each including transistors and each utilizing voltage differences each between electrodes of each transistor.

9. The abnormal voltage detection apparatus as claimed in claim 8,
wherein each of said level converter circuits lowers the voltage level of the abnormality detecting signal stepwise by a unit voltage, which is a voltage between the terminals of each of said battery blocks, to convert the voltage level thereof into the converted voltage level.

10. The abnormal voltage detection apparatus as claimed in claim 8,
wherein said level converter circuits comprises;
a first level lowering circuit for lowering the voltage level of the abnormality detecting signal for a first battery block of said battery blocks only by a unit voltage, which is a voltage between the terminals of each of said battery blocks, to convert the voltage level thereof into the converted voltage level, and
a second level lowering circuit for lowering the voltage level of the abnormality detecting signal for a second battery block of said battery blocks by a plurality of the unit voltages, to convert the voltage level thereof into the converted voltage level.

11. The abnormal voltage detection apparatus as claimed in claim 10, further comprising:
a third level lowering circuit for lowering the voltage level of the abnormality detecting signal for a third battery block of said battery blocks by the plurality of the unit voltages and then lowering a lowered voltage level thereof by the unit voltage to convert the voltage level thereof into the converted voltage level.

12. The abnormal voltage detection apparatus as claimed in claim 4, further comprising:
a second transmission device having an input terminal pair and an output terminal pair which are electrically insulated from each other, said second transmission device transmitting an output command signal generated by said external apparatus to said parallel-serial converter,
wherein said parallel-serial converter starts generating and outputting of the abnormality detecting information signal in accordance with the output command signal from said second transmission device.

* * * * *